United States Patent
Ding et al.

(10) Patent No.: US 9,276,596 B1
(45) Date of Patent: Mar. 1, 2016

(54) ANALOG TO DIGITAL CONVERTING APPARATUS AND INITIAL METHOD THEREOF

(71) Applicants: FARADAY TECHNOLOGY CORPORATION, Suzhou (CN); FARADAY TECHNOLOGY CORPORATION, Science-Based Industrial Park, Hsin-Chu (TW)

(72) Inventors: Xingbo Ding, Suzhou (CN); Feng Xu, Suzhou (CN); Min-Yuan Wu, Hsinchu (TW)

(73) Assignees: FARADAY TECHNOLOGY CORPORATION, Suzhou Industrial Park (CN); Faraday Technology Corp., Hsin-Chu (TW)

( * ) Notice: Subject to any disclaimer, the term of this patent is extended or adjusted under 35 U.S.C. 154(b) by 0 days.

(21) Appl. No.: 14/726,625

(22) Filed: Jun. 1, 2015

(30) Foreign Application Priority Data

Mar. 31, 2015 (CN) .......................... 2015 1 0149665

(51) Int. Cl.
*H03M 1/12* (2006.01)
*H03M 1/00* (2006.01)
*H03M 1/42* (2006.01)
*H03M 1/06* (2006.01)

(52) U.S. Cl.
CPC ................ *H03M 1/002* (2013.01); *H03M 1/06* (2013.01); *H03M 1/1245* (2013.01); *H03M 1/42* (2013.01)

(58) Field of Classification Search
CPC ..... H03M 1/002; H03M 1/42; H03M 1/1245; H03M 1/06; H03M 1/38; H03M 1/40; H03M 1/403
USPC .................................. 341/155, 161–163, 172
See application file for complete search history.

(56) References Cited

U.S. PATENT DOCUMENTS

| | | | |
|---|---|---|---|
| 7,151,475 B2 | 12/2006 | Boemler | |
| 7,167,121 B2* | 1/2007 | Carreau | H03M 1/1245 341/150 |
| 7,903,018 B2* | 3/2011 | Schatzberger | H03M 1/129 341/155 |
| 7,965,218 B2* | 6/2011 | Ohnhaeuser | H03M 1/08 341/161 |
| 8,471,755 B1* | 6/2013 | Figueiredo | H03M 1/468 341/155 |

* cited by examiner

*Primary Examiner* — Khai M Nguyen
(74) *Attorney, Agent, or Firm* — Winston Hsu; Scott Margo

(57) ABSTRACT

An analog to digital converting apparatus and an initial method thereof are provided. The analog to digital converting apparatus includes a first and a second switching capacitor units, a circuit unit, a first and a second initialization switches, a third and a fourth capacitors and a logic buffer. The first and the second switching capacitor units respectively couple first capacitors and second capacitors to a first logic voltage, a second logic voltage or a first or a second input voltage according to a first control signal, and respectively generate a first and a second voltage. The circuit unit compares the first voltage and the second voltage to generate the first control signal. The first and the second initialization switches are respectively connected in series between the first and the second voltage and a common-mode endpoint. The logic buffer outputs the first or the second logic voltage to the common-mode endpoint.

7 Claims, 3 Drawing Sheets

ANALOG TO DIGITAL CONVERTING APPARATUS AND INITIAL METHOD THEREOF

CROSS-REFERENCE TO RELATED APPLICATION

This application claims the priority benefit of Chinese application serial no. 201510149665.3, filed on Mar. 31, 2015. The entirety of the above-mentioned patent application is hereby incorporated by reference herein and made a part of this specification.

BACKGROUND OF THE INVENTION

1. Field of the Invention

The invention relates to an analog to digital converting apparatus, and particularly relates to a successive approximation register analog to digital converting apparatus.

2. Description of Related Art

In the recent trends of integrated circuit design, the demands for lower power consumption, higher performance, and lower cost are more and more strict. In the design of an analog front-end circuit, an efficient analog to digital converter (ADC) can significantly improve the overall performance of the system.

There are several different frameworks of ADC, such as flash ADC, pipeline ADC, successive approximation register ADC (SAR-ADC), and two-step ADC. These ADC frameworks respectively have suitable conditions. When the requirements on specification remain the same, SAR-ADC has the advantage of lower power consumption and smaller chip area over the pipeline ADC. Thus, the development on SAR-ADC has gradually been valued in relevant industries.

The current framework of SAR-ADC usually includes an analog buffer for generating a common mode voltage. However, when the converting precision and frequency of SAR-ADC are higher, the power of the analog buffer may significantly increase, making the circuit design more difficult.

SUMMARY OF THE INVENTION

The invention provides an analog to digital converting apparatus and an initial method thereof capable of replacing an analog buffer in the conventional design with a digital buffer to output a common mode voltage. Accordingly, an overall power of a successive approximation register analog to digital converting apparatus is reduced, and a difficulty in circuit design is thus reduced.

An analog to digital converting apparatus according to the invention includes a switching capacitor unit, a switching capacitor unit, a circuit unit, first and second initialization switches, third and fourth capacitors, and a logic buffer. The first switching capacitor unit has a plurality of first capacitors and a plurality of first switches respectively corresponding to the first capacitors. The first switching capacitor unit couples each of the first capacitors to a first logic voltage, a second logic voltage, or a first input voltage to generate a first voltage through one of the corresponding first switches according to a first control signal. The second switching capacitor unit has a plurality of second capacitors and a plurality of second switches respectively corresponding to the second capacitors. The second switching capacitor unit couples each of the second capacitors to the first logic voltage, the second logic voltage, or a second input voltage to generate a second voltage through one of the corresponding second switches according to a first control signal. The circuit unit generates the first control signal by comparing the first voltage and the second voltage. The first and second initialization switches are respectively serially connected between the first voltage and a common-mode endpoint and between the common-mode endpoint and the second voltage, and are turned on or off according to a second control signal. The third capacitor and the fourth capacitor respectively receive the first and second voltages and are commonly coupled to the common-mode endpoint. The logic buffer chooses to output the first logic voltage or the second logic voltage to the common-mode endpoint according to the second control signal. In addition, the second control signal indicates whether the analog to digital converting apparatus is in a sampling period or not.

An initial method of an analog to digital converting apparatus according to the invention is adapted for the analog to digital converting apparatus. The method includes: during a sampling period, coupling each of the first capacitors to the first input voltage, and coupling each of the second capacitors to the second input voltage; controlling to turn on the first and second initialization switches and controlling the logic buffer to output the first logic voltage to the common-mode endpoint; during a converting period, controlling to turn off the first and second initialization switches and controlling the logic buffer to output the second logic voltage to the common-mode endpoint; and adjusting the first control signal through successive approximation according to a comparison result between the first voltage and the second voltage, so as to couple each of the first capacitors and the second capacitors to the first logic voltage or the second logic voltage to generate a digital output signal associated with the first and second input voltages.

Based on the above, the analog to digital converting apparatus may provide the logic voltage at a first logic level to a common-mode endpoint by using a digital logic buffer during the sampling period, so as to sample the first and second input voltages. Also, during the converting period, the logic voltage changed to the second logic level is provided to the common-mode endpoint for successive approximation, so as to generate the digital output signal associated with the first and second input voltages. Accordingly, in the analog to digital conversion, the analog buffer in the conventional design may be replaced, so as to reduce the overall power and design difficulty of the circuit.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
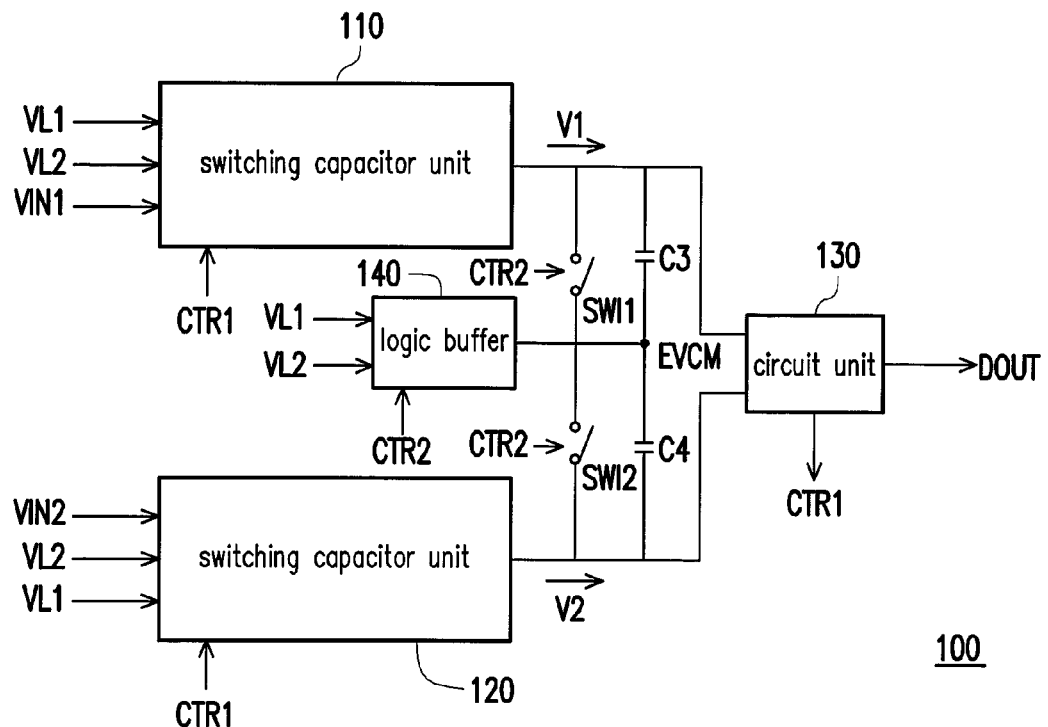
FIG. 1 is a schematic view illustrating an analog to digital converting apparatus according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Referring to FIG. 1, FIG. 1 is a schematic view illustrating an analog to digital converting apparatus according to an embodiment of the invention. In this embodiment, an analog to digital converting apparatus 100 includes a switching capacitor unit 110, a switching capacitor unit 120, a circuit unit 130, initialization switches SWI1 and SWI2, capacitors C3 and C4, and a logic buffer 140. The switching capacitor unit 110 receives a logic voltage VL1, a logic voltage VL2, and an input voltage VIN1, and has a plurality of capacitors and a plurality of switches respectively corresponding to the capacitors. The switches may be controlled by a control signal CTR1 to couple the respectively corresponding capacitors to one of the logic voltage VL1, the logic voltage VL2, and the input voltage VIN1 to make the switching capacitor unit 110 generate a voltage V1. In this embodiment, the logic voltage VL1 is at a low logic level, and the logic voltage VL2 is at a high logic level.

Similarly, the switching capacitor unit 120 receives the logic voltage VL1, the logic voltage VL2, and an input voltage VIN2, and has a plurality of capacitors and a plurality of switches respectively corresponding to the capacitors. The switches may be controlled by the control signal CTR1 to couple the respectively corresponding capacitors to one of the logic voltage VL1, the logic voltage VL2, and the input voltage VIN2 to make the switching capacitor unit 120 generate a voltage V2.

In FIG. 1, the circuit unit 130 may compare the voltage V1 and the voltage V2 and generate the control signal CTR1 according to a comparison result. In addition, when the analog to digital converting apparatus 100 performs analog to digital conversion, the circuit unit 130 may generate a digital output signal DOUT associated with the input voltages VIN1 and VIN2 through successive approximation (SAR) according to the comparison result between the voltage V1 and the voltage V2. Besides, the initialization switches SWI1 and SWI2 are respectively serially connected between the voltage V1 and a common-mode endpoint EVCM and between the common-mode endpoint EVCM and the voltage V2, and are turned on or off according to a control signal CTR2. The capacitor C3 and the capacitor C4 respectively receive the voltage V1 and the voltage V2 and are commonly coupled to the common-mode endpoint EVCM. As shown in FIG. 1, the capacitors C3 and C4 are respectively connected in parallel with the initialization switches SWI1 and SWI2.

The logic buffer 140 is a digital buffer, for example. In FIG. 1, the logic buffer 140 receives the logic voltage VL1 and the logic voltage VL2, and may choose to output the logic voltage VL1 or the logic voltage VL2 to the common-mode endpoint EVCM according to the control signal CTR2. In addition, the control signal CTR2 may be used to indicate whether the analog to digital converting apparatus 100 is in a sampling period.

Figure 2:
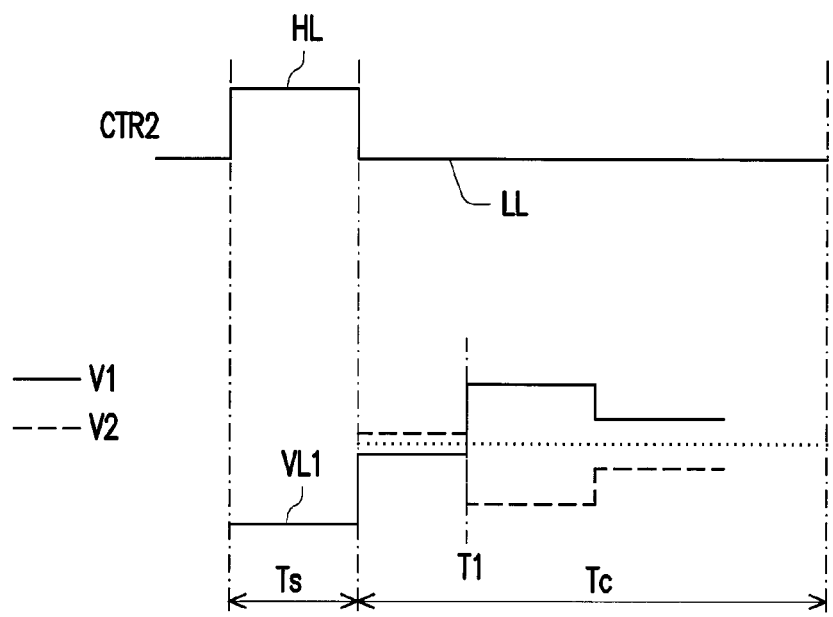
FIG. 2 is a signal waveform diagram illustrating an analog to digital converting apparatus according to an embodiment of the invention.

Specifically, the analog to digital converting apparatus 100 in this embodiment of the invention may be divided into two periods/phases, namely the sampling period and a converting period. Specifically, FIG. 2 is a signal waveform diagram illustrating an analog to digital converting apparatus according to an embodiment of the invention. Referring to FIG. 2, FIG. 2 exemplifies waveforms of the control signal CTR2, the voltage V1 (solid line) and the voltage V2 (broken line) during the sampling period Ts and the converting period Tc. According to the waveform of the control signal CTR2, when the control signal CTR2 is at a high logic level HL (logic 1), it is indicated that the analog to digital converting apparatus 100 is in the sampling period Ts for initialization. When the control signal CTR2 is at a low logic level LL (logic 0), it is indicated that the analog to digital converting apparatus 100 is in the converting period Tc. It should be noted that, in other embodiments, the control signal CTR2 may also indicate the states of the analog to digital converting apparatus 100 according to the logical levels opposite to the above description, and the embodiments of the invention are not limited thereto.

Referring to FIGS. 1 and 2 together, in a circuit operation, during the sampling period Ts, the circuit unit 130 may couple the capacitors in the switching capacitor unit 110 to the input voltage VIN1 through the control signal CTR1, and couple the capacitors in the switching capacitor unit 120 to the input voltage VIN2. In addition, the initialization switches SWI1 and SWI2 are turned on under the control of the control signal CTR2 at the high logic level HL, for example, so as to make a connecting path between the common-mode endpoint EVCM and the voltages V1 and V2 a short circuit. Then, the logic buffer 140 may output the logic voltage VL1 to the common-mode endpoint EVCM according to the control signal CTR2. Accordingly, the logic buffer 140 may be directly connected to the switching capacitor unit 110 and the switching capacitor unit 120 through the common-mode endpoint EVCM, and provide the logic voltage VL1 to two input terminals of the circuit unit 130 with a common mode, so as to sample the input voltage VIN1 and the input voltage VIN2 by using the switching capacitor unit 110 and the switching capacitor unit 120. As shown in FIG. 2, during the sampling period Ts, voltages V1 and V2 at the two input terminals of the circuit unit 130 are equal to the logic voltage VL1.

Accordingly, after the sampling period Ts, the analog to digital converting apparatus 100 enters the converting period Tc. During the converting period Tc, the analog to digital converting apparatus 100 may include a plurality of converting phases according to the number of bits in the digital output signal DOUT. Also, in each converting phase, the analog to digital converting apparatus 100 may determine a bit value (i.e., 1 or 0) of the corresponding bit in the digital output signal DOUT through successive approximation. Also, the analog to digital conversion is completed after all the bit values of the digital output signal DOUT are determined.

In an operation of the converting period Tc, the initialization switches SWI1 and SWI2 are firstly turned off under the control of the control signal CTR2 at the low logic level LL, for example. In addition, the logic buffer 140 may output the logic voltage VL2 to the common-mode endpoint EVCM according to the control signal CTR2 changed to the low logic level LL. Under this condition, a voltage value of the voltage V1 at a terminal coupling the circuit unit 130, the capacitor C3, and the switching capacitor unit 110 may be offset. In addition, an offset value Vofs1 may be represented in Formula (2) below.

$$Vofs1 = \frac{C3}{(C3 + CA1)} \times (VL2 - VL1) \qquad (1)$$

Here, in Formula (1), CA1 represents an equivalent capacitance value provided by the switching capacitor unit 110.

In addition, a voltage value of the voltage V2 at a terminal coupling the circuit unit 130, the capacitor C4, and the switching capacitor unit 120 may be offset. In addition, an offset value Vofs2 may be represented in Formula (2) below.

$$Vofs2 = \frac{C4}{(C4 + CA2)} \times (VL2 - VL1) \qquad (2)$$

Here, in Formula (2), CA2 represents an equivalent capacitance value provided by the switching capacitor unit 120.

As shown in FIG. 2, when entering the converting period Tc from the sampling period Ts, the voltages V1 and V2 at the input terminals of the circuit unit 130 may become differential because the connecting path with the common-mode endpoint EVCM is turned off. In addition, the circuit unit 130 compares the voltages V1 and V2. After the comparison, the circuit unit 130 may determine a bit value of a most significant bit (MSB) of the digital output signal DOUT according to the comparison result between the voltages V1 and V2.

Next, after the most significant bit of the digital output signal DOUT is obtained, the control signal CTR1 may be adjusted through successive approximation. With the control signal CTR1 being changed successively, the capacitors in the switching capacitor units 110 and 120 may change the received voltage values, so as to change the voltage values of the voltages V1 and V2. As shown in FIG. 2, by changing the voltages V1 and V2 at a time point T1, the circuit unit 130 may proceed to compare the changed voltages V1 and V2 to determine a bit value of the next bit of the digital output signal DOUT. Then, the process is repeated until the circuit unit 130 determines the bit values of all the bits of the digital output signal DOUT through successive approximation, so as to complete the analog to digital conversion of the input voltages VIN1 and VIN2.

In this embodiment, the digital logic buffer 140 in the analog to digital converting apparatus 100 may replace an analog buffer to perform the analog to digital conversion, so as to reduce an overall power and a design complexity of the circuit when a converting frequency is higher and reduce the time for the analog to digital conversion. It should also be mentioned that the logic buffer 140 may be achieved with an inverter commonly used in the digital circuit design.

Figure 3:
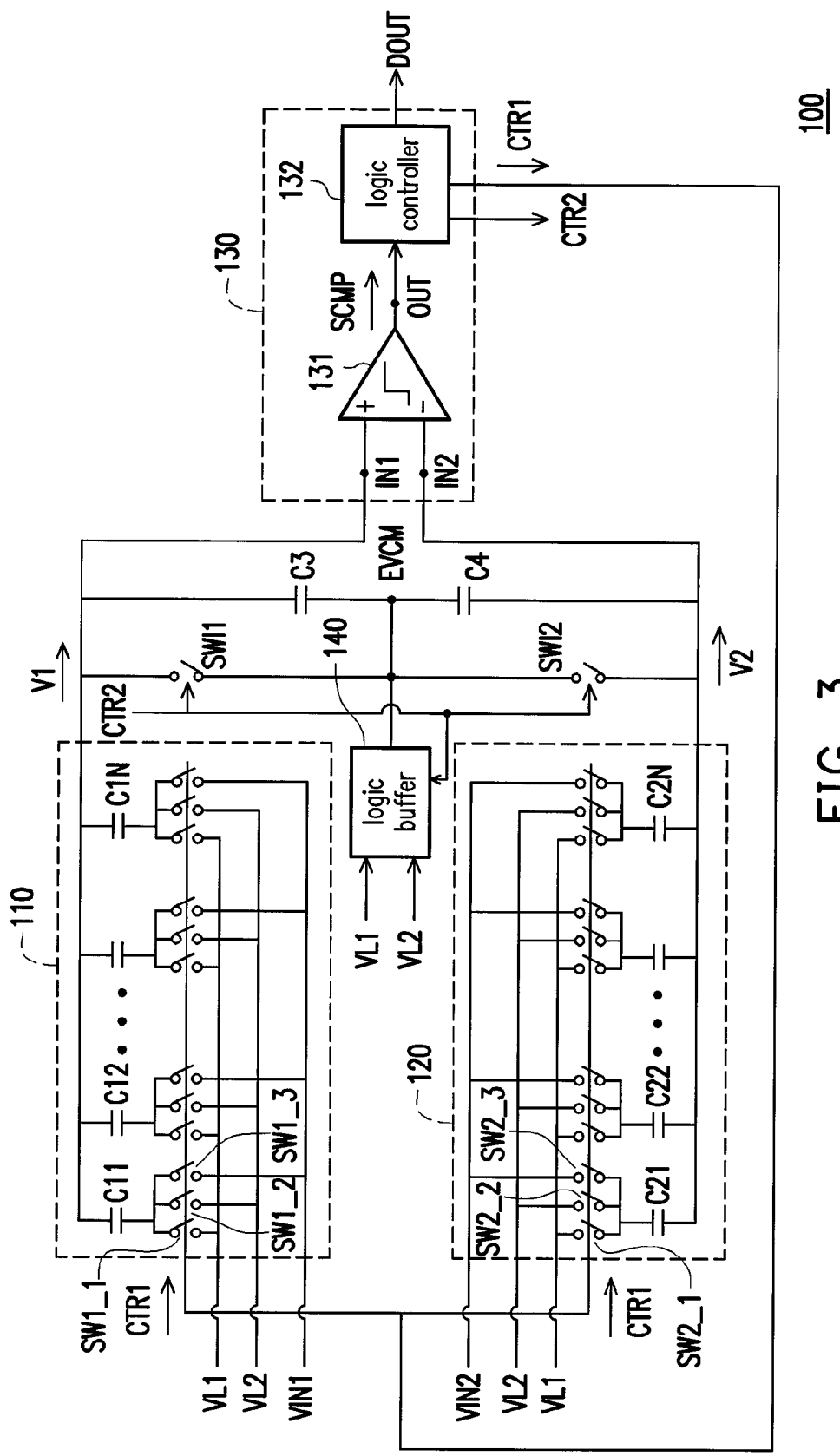
FIG. 3 is a schematic view illustrating an analog to digital converting apparatus according to an embodiment of the invention.

Referring to FIG. 3, FIG. 3 is a schematic view illustrating an embodiment of the analog to digital converting apparatus shown in the embodiment of FIG. 1. The analog to digital converting apparatus 100 includes the switching capacitor unit 110, the switching capacitor unit 120, the circuit unit 130, the initialization switches SWI1 and SWI2, the capacitors C3 and C4, and the logic buffer 140. The switching capacitor unit 110 has a plurality of capacitors C11 to C1N. The switching capacitor unit 110 also has a plurality of switches respectively corresponding to the capacitors C11 to C1N. The switching capacitor unit 110 may control to turn on one of the switches corresponding to the capacitors C11 to C1N according to the control signal CTR1, so as to couple the capacitors C11 to C1N of the switching capacitor unit 110 to one of the logic voltage VL1, the logic voltage VL2, and the input voltage VIN1 to generate the voltage V1.

Taking the capacitor C11 as an example, switches SW1_1, SW1_2, and SW1_3 corresponding to the capacitor C11 are controlled by the control signal CTR1. Also, when the switch SW1_1 is turned on (the switches SW1_2 and 1_3 are turned off), the capacitor C11 receives the logic voltage VL1. When the switch SW1_2 is turned on (the switches SW1_1 and 1_3 are turned off), the capacitor C11 receives the logic voltage VL2. When the switch SW1_3 is turned on (the switches SW1_1 and 1_2 are turned off), the capacitor C11 receives the input voltage VIN1.

It should be noted that only one of the switches SW1_1, SW1_2, and SW1_3 is turned on during the converting period and the sampling period. In other words, a terminal jointly coupling the switches SW1_1 to SW1_3 does not transmit two or more different voltages at the same time.

In FIG. 3, the switching capacitor unit 120 has a plurality of capacitors C21 to C2N. The switching capacitor unit 120 also has a plurality of switches corresponding to the capacitors C21 to C2N. The switching capacitor unit 120 may control to turn on one of the switches corresponding to the capacitors C21 to C2N according to the control signal CTR1, so as to couple the capacitors C21 to C2N of the switching capacitor unit 120 to one of the logic voltage VL1, the logic voltage VL2, and the input voltage VIN2 to generate the voltage V2.

Taking the capacitor C21 as an example, switches SW2_1, SW2_2, and SW2_3 corresponding to the capacitor C21 are controlled by the control signal CTR1. Also, when the switch SW2_1 is turned on (the switches SW2_2 and SW 2_3 are turned off), the capacitor C21 receives the logic voltage VL1. When the switch SW2_2 is turned on (the switches SW2_1 and SW2_3 are turned off), the capacitor C21 receives the logic voltage VL2. When the switch SW2_3 is turned on (the switches SW2_1 and SW2_2 are turned off), the capacitor C21 receives the input voltage VIN2. Similarly, a terminal jointly coupling the switches SW1_1 to SW1_3 controlled by the control signal CTR1 does not transmit two or more different voltages at the same time.

Also, in the switching capacitor unit 110, capacitance values of the capacitors C11 to C1N may exhibit a proportional relation. For example, the capacitance values of the capacitors C11 to C1N may be arranged according to a power of 2. In other words, the capacitance value of the capacitor C12 may be two times of the capacitance value of the capacitor C11, and the capacitance value of the capacitor C1N may be 2(N−1) times of the capacitor C11.

Similar to the switching capacitor unit 110, capacitance values of the capacitors C21 to C2N may also exhibit a proportional relation. For example, the capacitance values of the capacitors C21 to C2N may be arranged according to a power of 2. In other words, the capacitance value of the capacitor C22 may be two times of the capacitance value of the capacitor C21, and the capacitance value of the capacitor C2N may be 2(N−1) times of the capacitor C21.

The circuit unit 130 includes a comparator 131 and a logic controller 132. The comparator 131 has an input terminal IN1, an input terminal IN2, and an output terminal OUT. The input terminal IN1 of the comparator 131 receives the voltage V1, the input terminal IN2 of the comparator 131 receives the voltage V2, and the logic controller 132 is coupled to the output terminal OUT of the comparator 131. In this embodiment, the logic controller 132 provides the control signals CTR1 and CTR2, and may adjust the control signal CTR1 through successive approximation according to a comparison signal SCMP generated by the output terminal OUT of the comparator 131. Accordingly, through the successively approximated analog to digital conversion, the logic controller 132 may output the converted digital output signal DOUT. It should be noted that, in other embodiments, the control signal CTR2 may also be provided by another signal generating unit, and the embodiments of invention are not limited thereto.

In this embodiment, the comparator 131 may also be a comparator in any form that people having ordinary skills in the art are familiar with, or the comparator 131 may also be a hysteresis comparator. Besides, the logic controller 132 may be a successive approximation (SAR) logic controller.

Figure 4:
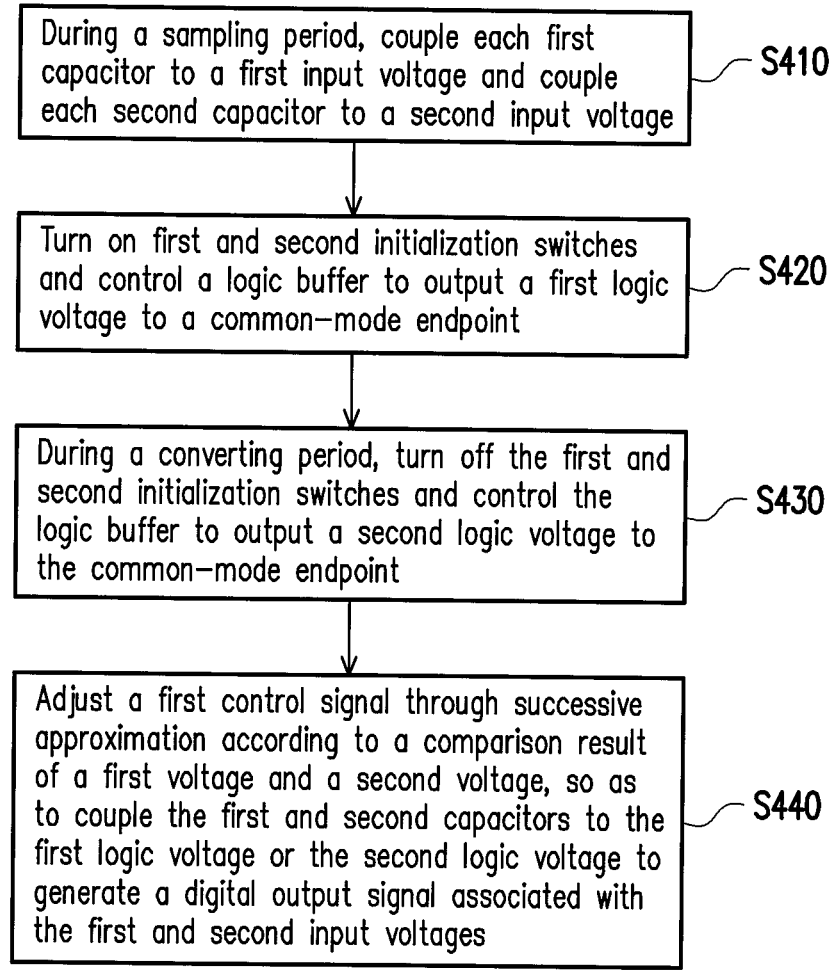
FIG. 4 is a flowchart illustrating an initial method of an analog to digital converting apparatus according to an embodiment of the invention.

FIG. 4 is a flowchart illustrating an initial method of an analog to digital converting apparatus according to an embodiment of the invention. The initial method of the analog to digital converting apparatus according to the embodiments of the invention is adapted for the analog to digital converting apparatus 100 shown in FIG. 1. Referring to FIGS. 1 and 4, at Step S410, during the sampling period, the capacitors of the switching capacitor unit 110 are coupled to the input voltage VIN1, and the capacitors of the switching capacitor unit 120 are coupled to the input voltage VIN2. Also, at Step S420, the initialization switches SWI1 and SWI2 are controlled to be turned on, and the logic buffer 140 is controlled to output the logic voltage VL1 to the common-mode endpoint EVCM. Then, at Step S430, during the converting period, the initialization switches SWI1 and SWI2 are controlled to be turned off, and the logic buffer 140 is controlled to output the logic voltage VL2 to the common-mode endpoint EVCM. Also, at Step S440, the control signal CTR1 is adjusted through successive approximation according to the comparison result between the voltages V1 and V2, such that the capacitors C11 to C1N and the capacitors C21 to C2N are coupled to the logic voltage VL1 or the logic voltage VL2, so as to generate the digital output signal DOUT associated with the input voltages VIN1 and VIN2.

Besides, details concerning the steps for carrying out the initial method of the analog to digital apparatus shown in FIG. 4 are already described in the previous embodiments. Thus, details in this respect are not reiterated in the following.

In view of the foregoing, successively approximated analog to digital conversion is realized in the invention by using the digital logic buffer. Thus, the digital logic buffer may replace the conventional analog buffer to perform the analog to digital conversion, so as to reduce the overall power and design complexity of the circuit and thus improve an overall performance of the analog-to-digital device.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An analog to digital converting apparatus, comprising:
a first switching capacitor unit, having a plurality of first capacitors and a plurality of first switches respectively corresponding to the first capacitors, wherein the first switching capacitor unit couples each of the first capacitors to a first logic voltage, a second logic voltage, or a first input voltage to generate a first voltage through one of the corresponding first switches according to a first control signal;
a second switching capacitor unit, having a plurality of second capacitors and a plurality of second switches respectively corresponding to the second capacitors, wherein the second switching capacitor unit couples each of the second capacitors to the first logic voltage, the second logic voltage, or a second input voltage to generate a second voltage through one of the corresponding second switches according to the first control signal;
a circuit unit, generating the first control signal by comparing the first voltage and the second voltage;
a first and second initialization switches, respectively serially connected between the first voltage and a common-mode endpoint and between the common-mode endpoint and the second voltage, and being turned on or off according to a second control signal;
a third capacitor and a fourth capacitor, respectively receiving the first and second voltages and commonly coupled to the common-mode endpoint; and
a logic buffer, choosing to output the first logic voltage or the second logic voltage to the common-mode endpoint according to the second control signal,
wherein the second control signal indicates whether the analog to digital converting apparatus is in a sampling period or not.

2. The analog to digital converting apparatus as claimed in claim 1, wherein the circuit unit comprises:
a comparator, having a first input terminal, a second input terminal, and an output terminal, wherein the first input terminal of the comparator is coupled to the first voltage, and the second input terminal of the comparator is coupled to the second voltage; and
a logic controller, coupled to the output terminal of the comparator to provide the first and second control signals, wherein during the sampling period, the logic controller couples the first capacitors to the first input voltage and couples the second capacitors to the second input voltage by using the first control signal.

3. The analog to digital converting apparatus as claimed in claim 2, wherein during the sampling period, the logic controller turns on the first and second initialization switches by using the second control signal, and makes the logic buffer output the first logic voltage to the common-mode endpoint.

4. The analog to digital converting apparatus as claimed in claim 2, wherein during a converting period, the logic controller adjusts the first control signal through successive approximation (SAR) according to a comparison signal generated at the output end of the comparator, so as to couple each of the first and second capacitors to the first logic voltage or the second logic voltage to generate a digital output signal associated with the first and second input voltages, where during the converting period is after the sampling period.

5. The analog to digital converting apparatus as claimed in claim 4, wherein during the converting period, the logic controller turns off the first and second initialization switches by using the second control signal, makes the logic buffer output the second logic voltage to the common-mode endpoint, and makes the first and second input terminals of the comparator respectively generate a first offset voltage and a second offset voltage.

6. The analog to digital converting apparatus as claimed in claim 5, wherein the first and second offset voltages equal to:

$$\frac{CB}{(CB+CA)} \times (VL2 - VL1)$$

wherein CB is a capacitance value of the third or fourth capacitor, VL1 and VL2 are respectively voltage values of the first and second logic voltages, and CA is an equivalent capacitance value provided by the first switching capacitor unit or the second switching capacitor unit.

7. An initial method of an analog to digital converting apparatus, adapted for the analog to digital converting apparatus as claimed in claim 1, comprising:

- during a sampling period, coupling each of the first capacitors to the first input voltage, and coupling each of the second capacitors to the second input voltage;
- controlling to turn on the first and second initialization switches and controlling the logic buffer to output the first logic voltage to the common-mode endpoint;
- during a converting period, controlling to turn off the first and second initialization switches and controlling the logic buffer to output the second logic voltage to the common-mode endpoint; and
- adjusting the first control signal through successive approximation according to a comparison result between the first voltage and the second voltage, so as to couple each of the first capacitors and the second capacitors to the first logic voltage or the second logic voltage to generate a digital output signal associated with the first and second input voltages.

* * * * *